(12) United States Patent
Jarrett et al.

(10) Patent No.: US 11,817,371 B2
(45) Date of Patent: Nov. 14, 2023

(54) NON-PLANAR CONFORMING HEATSINK

(71) Applicant: Intel Corporation, Santa Clara, CA (US)

(72) Inventors: Brian S. Jarrett, Hillsboro, OR (US); Joseph Andrew Broderick, Beaverton, OR (US); Juan Gabriel Cevallos Palomeque, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1010 days.

(21) Appl. No.: 16/143,373

(22) Filed: Sep. 26, 2018

(65) Prior Publication Data

US 2020/0098665 A1 Mar. 26, 2020

(51) Int. Cl.
*H01L 23/427* (2006.01)
*H01L 21/48* (2006.01)

(52) U.S. Cl.
CPC ........ *H01L 23/427* (2013.01); *H01L 21/4882* (2013.01)

(58) Field of Classification Search
CPC ................ H01L 23/427; F28F 3/042–046
See application file for complete search history.

(56) References Cited

U.S. PATENT DOCUMENTS

| | | | | |
|---|---|---|---|---|
| 6,729,383 B1* | 5/2004 | Cannell | ................ | H01L 23/473 257/E23.098 |
| 10,446,466 B1* | 10/2019 | Milne | ................ | H01L 23/3677 |
| 2007/0256810 A1* | 11/2007 | Di Stefano | ........... | H01L 23/473 165/46 |
| 2012/0300402 A1* | 11/2012 | Vos | ........................ | H01L 23/473 165/104.33 |
| 2013/0240884 A1* | 9/2013 | Barth | .................... | H01L 23/544 257/532 |
| 2013/0284404 A1* | 10/2013 | Matsushima | ........... | B23P 11/00 165/104.19 |
| 2016/0091260 A1* | 3/2016 | Schultz | ................... | F28F 3/022 165/185 |
| 2016/0290905 A1* | 10/2016 | Ayotte | ..................... | G01N 3/42 |
| 2017/0363373 A1* | 12/2017 | Cai | ..................... | F28D 15/0233 |

* cited by examiner

*Primary Examiner* — Kevin Parendo
(74) *Attorney, Agent, or Firm* — Akona IP

(57) ABSTRACT

Semiconductor packages including a computing device with a heat source, and related devices and methods, are disclosed herein. For example, the computing device may have a heatsink physically and thermally coupled with the heat source. The heatsink may include a structural element internal to the heatsink. The structural element may cause a surface of the heatsink to deform to a non-planar configuration when the heatsink is coupled to the heat source.

23 Claims, 7 Drawing Sheets

Identifying a sidewall of a heatsink that includes a chamber at least partially defined by the sidewall, wherein the sidewall includes an internal surface and an external surface opposite the internal surface
605

Positioning, within the chamber of the heatsink, a plurality of structural elements, wherein the plurality of structural elements are to facilitate deformation of the sidewall to a non-planar state when the external surface is coupled with a heat source
610

Figure 6

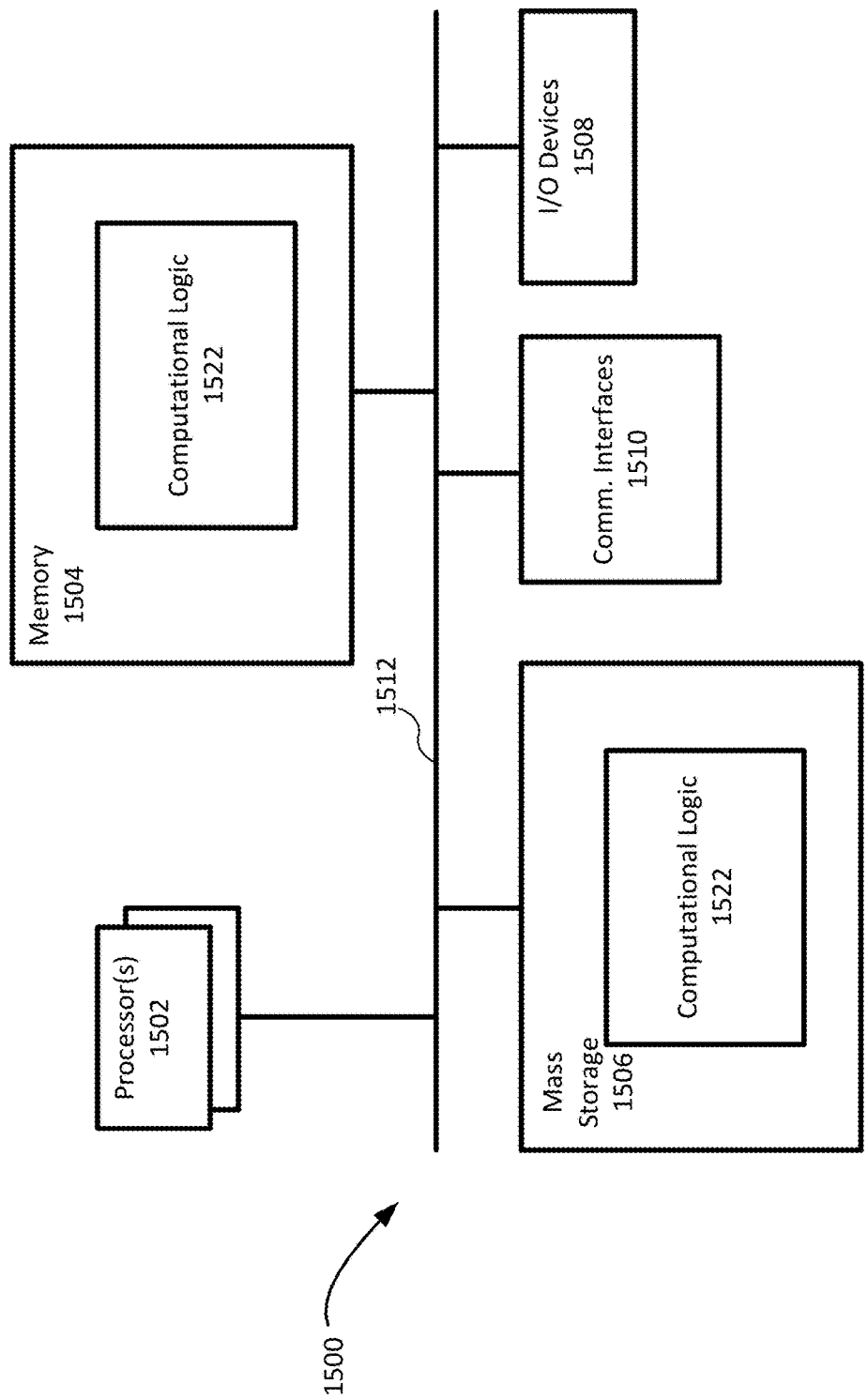

NON-PLANAR CONFORMING HEATSINK

BACKGROUND

Generally, semiconductor packages may include a plurality of dies. In some instances, the dies may be at different levels within the package. In other instances, the dies may have different workloads and therefore generate different amounts of heat. These factors may result in an integrated heat spreader (IHS) or die package being non-planar, which may negatively impact the efficiency of a heatsink attached to the IHS or die package.

BRIEF DESCRIPTION OF THE DRAWINGS

FIG. 6 depicts an example technique that may be used to manufacture a non-planar conforming heatsink, in accordance with various embodiments herein.

FIG. 7 illustrates an example device that may use various embodiments herein, in accordance with various embodiments.

DETAILED DESCRIPTION

Figure 1:
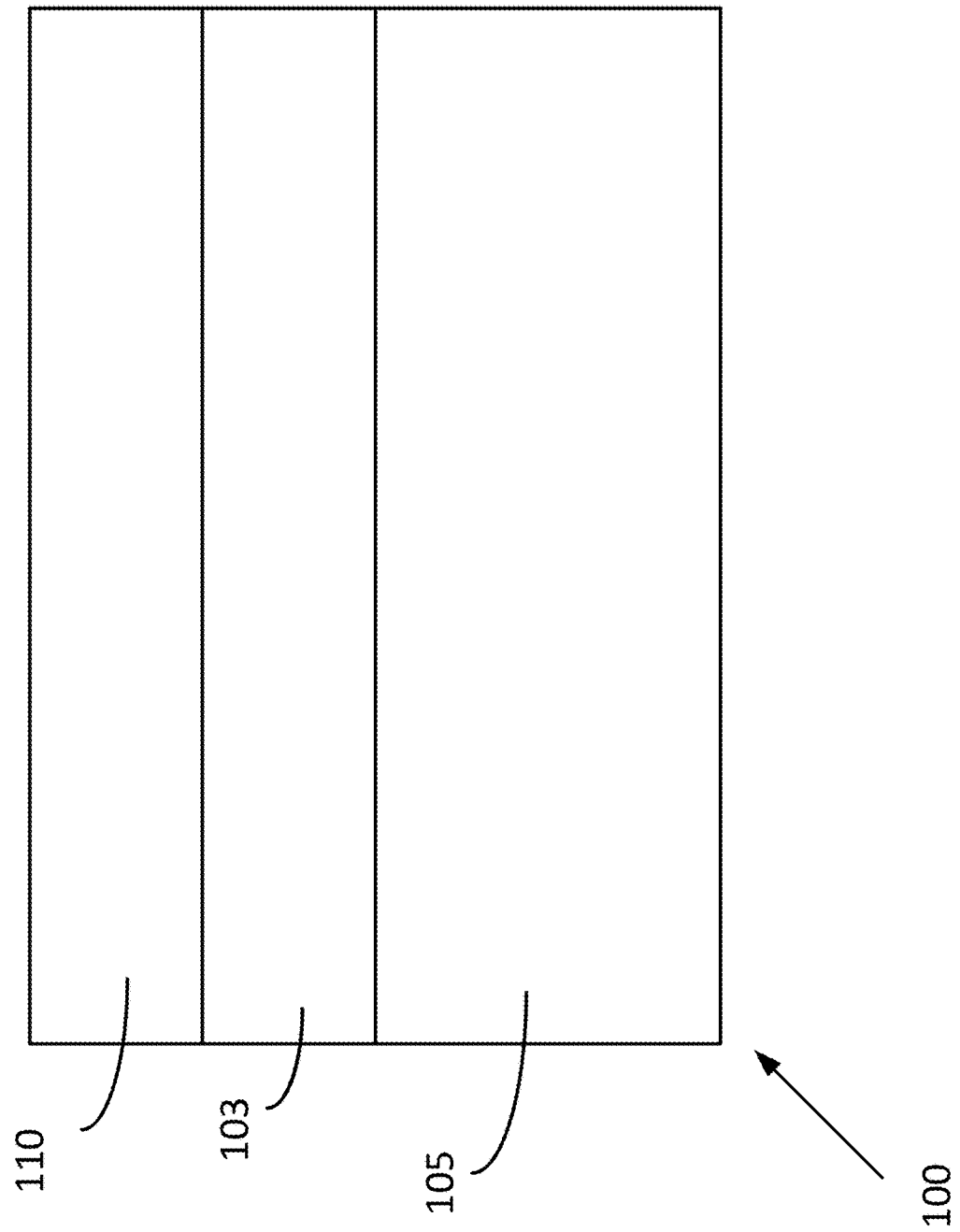
FIG. 1 depicts an example semiconductor structure, in accordance with various embodiments herein.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or thermal contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical, electrical, or thermal contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

As noted above, legacy thermal solutions may not be capable of conforming to non-planar surfaces. Optimum thermal performance may rely on the interaction between two flat surfaces to transfer heat from a semiconductor package to a heatsink. However, in many cases the surfaces between the semiconductor package and the heatsink may be discarded due to things like manufacturing processes, thermal expansion, or force applied by a mechanism holding the heatsink to the package.

Additionally, packages may have increased thermal energy when power is applied to a die within the package. For example, if the die is a processor, then operation of the die may generate heat. A thermal solution such as a heatsink is often mated to the package to remove the heat. The thermal interface surface on the package may often be one or more bare die, or some type of IHS.

More generally, the packages may include a plurality of processors. These packages may be referred to as "multichip packages." Bare die multichip packages may typically have dies of more than one elevation; that is, the dies may be non-coplanar. As a result, the surfaces of these multichip packages may be nonparallel. These non-coplanar, nonparallel surfaces may affect the ability to efficiently cool the packages using thermal solution.

When used, an IHS may be designed to have a planar (i.e., flat) surface that mates with a package. This flat surface may provide a thermal interface surface for a cooling mechanism or assembly such as a heatsink. However, when power is applied to a die of the package, thermal energy may be generated and the IHS may get hot. As the IHS gets hot, thermal expansion may cause the IHS to distort by bowing or warping. The heat source(s), e.g., the die(s), and the IHS geometry may affect the amount and direction of the bow and warp. Other factors that may affect the distortion of the IHS may include the IHS manufacturing process, and the process to attach the IHS to the processor package. In many cases, the amount and direction of this distortion may not be predictable. Additionally, the resultant non-planar surface may affect the ability to efficiently cool the package.

As noted above, thermal solution such as heatsinks may be mated with the IHS to remove thermal energy. The heatsinks may be, for example, a vapor chamber heatsink. Vapor chambers may be typically constructed of two layers of thin copper material joined at the edges to create a sealed cavity. A wick material may generally cover the internal surface of the sealed cavity, and be charged with a fluid. The vapor chamber may spread and transfer heat from a heat source (e.g., an IHS or a bare die) to a heat sink through evaporation and condensation of the fluid. Generally, these thin sheets of soft copper may easily deform, and therefore the vapor chamber may include internal supports, pedestals, or some other type of support between the layers to help to prevent the deformation. The combination of the heat, force applied by coupling the heatsink with an IHS, and locations of the supports may make the distortion of the vapor chamber heatsink unpredictable. This distortion may affect the thermal performance of the heatsink.

In many cases, thermal interface materials (TIMs) may be used to facilitate the transfer between the IHS or the package, and heatsinks or vapor chambers. Generally, with two flat surfaces (e.g., the IHS and the heatsink or vapor chamber surface), the thickness of the TIMs may be relatively thin, and the thermal load may be uniformly distributed along the face of the heatsink or vapor chamber. The TIMs thickness may provide a nominal gap between the IHS surface and the surface of the heatsink or vapor chamber. This thickness may be referred to as the "bond line." Generally, a thin TIM bond line may have higher thermal performance than a thick TIM bond line. The distortion in an IHS and a heatsink or vapor chamber may create larger than expected gaps between the two surfaces. These gaps may exceed the TIM bond line thickness, resulting in voids (e.g., areas where the TIM does not contact a surface). The voids created by the distorted surfaces may significantly reduce the thermal performance of the heatsink.

Embodiments herein may improve the thermal performance of the heatsink by increasing efficiency of the heatsink when the surface of the IHS or the package is non-planar. More specifically, embodiments herein may relate to improving thermal performance of a heatsink by providing a heatsink that is capable of more efficiently mating with a non-planar heat source such as a multi or single die package or an IHS. Specifically, enabling thermal solutions with feature sets that conform to distorted surfaces may improve heat transfer between two non-planar surfaces. Strategically locating supports with varying lengths within the heatsink or vapor chamber may compensate for known high or points in a distorted IHS profile. The supports may be individual parts added to the heatsink or vapor chamber, or they may be integral features of the heatsink or vapor chamber. Other embodiments may use supports that are configured to "crush-to-length" under a load. Other embodiments may use some combination of the above.

Generally, as processor packages increase in size or power, non-coplanar surfaces of bare die packages or an IHS may become more prevalent or more pronounced. Meeting these nonuniform surfaces with a heatsink or vapor chamber surface may adversely affect thermal performance of the package or the thermal solution. The ability for a heatsink or vapor chamber surface to conform to a given profile, for example as described by embodiments herein, may provide several advantages. The advantages may include, for example, decreasing load requirements on the thermal solution, reducing cost of the overall package, improving thermal performance by eliminating voids, reducing bond line thicknesses, or other advantages. As a result, the improved thermal performance may allow processors to run at higher frequencies (i.e., generating more heat), or some other advantage.

Generally, as noted above, multichip packages may initially have coplanar surfaces. However, when the multichip packages are used, the IHS on the package may distort when power is applied to dies of the package, and the package or the dies become hot. In some cases, these uneven or distorted surfaces may be difficult to predict, but may be measured after processor packages are produced in volume. Once the distortion profile is known, the profile of a heatsink or vapor chamber may be contoured to align with the distortion profile.

One technique for contouring the profile of the heatsink or vapor chamber may be to strategically place pedestals of varying length within the vapor chamber. As an example, tall pedestals may be placed where the IHS has low points (or where dies of the package are relatively short), and short pedestals may be placed where the IHS has high points (or where dies of the package are relatively tall). When the vapor chamber's thin copper sheets are assembled, the thin copper sheets may contact these pedestals and deform to create a contoured profile. This technique may permit the copper sheet to conform to the distorted surface of the IHS or the package, and eliminate excessive gaps that may decrease thermal performance.

In another technique, internal supports may be designed to "crush-to-length" under a set load. Each support may have the ability to independently yield or deform under load, and establish the necessary height to eliminate the voids that may occur due to the distorted or mismatched profiles of bare die packages or an IHS and the heatsink or vapor chamber. As an example, one technique to permit "crush-to-length" may be to create small indentations or dimples in one of the thin copper sheets used in a vapor chamber. The shape and size of the geometry of these features may be designed to yield or collapse under a known load. The height of these features may also be set to compensate for high or low areas of the IHS or the package. The ability to yield under a load may provide a consistent bond line, reduce load requirements, and simplify the loading mechanism design. Additionally, the ability for the supports to yield to length may eliminate the need to measure the non-coplanar bare die surfaces of the package or the distorted surface of the IHS.

Generally, embodiments herein may be compatible with legacy vapor chamber manufacturing technology. Specifically, a vapor chamber with this capability may be attached to a heatsink, a coldplate, or a heat exchanger, thereby improving the thermal performance of the thermal solution.

FIG. 1 depicts an example semiconductor structure 100, in accordance with various embodiments herein. The structure 100 may include a semiconductor package 105. The package 105 may include one or more dies which may include, for example, a processor, a memory, some other type of storage or logic, or some other type of die. The dies may be coupled to or embedded within a substrate material which may be, for example, a cored or coreless substrate, an organic substrate, or some other type of substrate. In some embodiments, the dies may be covered by an overmold material such as an epoxy material or some type of dielectric material, while in other embodiments the overmold may not be present. When the overmold or an IHS are not present, and the dies are exposed, the package 105 may be considered to be a "bare die" package as has been discussed herein. When the package 105 includes a plurality of dies, the package may be considered to be a "multichip" package as discussed herein.

The package 105 may be coupled with an IHS 103. Generally, the IHS 103 may be designed to absorb heat from points of the package 105 and spread the heat more evenly so that it may then be more effectively radiated, conducted, or convected from the surface of the IHS 103. The IHS 103 may be formed of a material such as lead, copper, aluminum, or some other thermally conductive material. In embodiments, the IHS 103 may be either a solid piece of material or it may have one or more cavities either on the surface of the IHS 103 or internally within the IHS 103. In some embodiments, the IHS may be composed of a plurality of pieces of thermally conductive material. In these embodiments, one piece of the plurality of pieces may be a different thermally conductive material than another piece of the plurality of pieces of the IHS.

The IHS 103 may then be coupled with a thermal solution such as a heatsink. In embodiments, the heatsink may be a vapor chamber 110. As described above, the vapor chamber may include two relatively thin copper sheets that form a chamber. A wicking structure may be positioned within the chamber, as well as a liquid. When the liquid is heated by thermal energy, for example from the IHS 103, then the liquid may turn into a vapor, and subsequently condense again when it comes into contact with a relatively colder surface. The liquid may then be wicked back to the warm surface to evaporate once more. This cycle may assist with the spreading and transferring of heat from one surface (e.g., the IHS 103) to the other through heat of evaporation/condensation. In some embodiments, the structure 100 may include further elements of a thermal solution on top of the vapor chamber 110. For example, in some embodiments the vapor chamber 110 may be coupled with heat fins, liquid cooling, or some other heat exchange element.

As noted above, in some embodiments the IHS 103 may not be present in the structure, rather the vapor chamber 110 may be coupled directly with the package 105. Additionally, in some embodiments the TIM may be present between the package 105 and the IHS 103, between the IHS 103 and the vapor chamber 110, or in embodiments where the IHS is not present, between the package 105 and the vapor chamber 110. In various embodiments, the TIM may include materials such as greases, phase-change materials (e.g., polymer-filled phase-change materials), curable gels, gap pads, etc.

Figure 2:
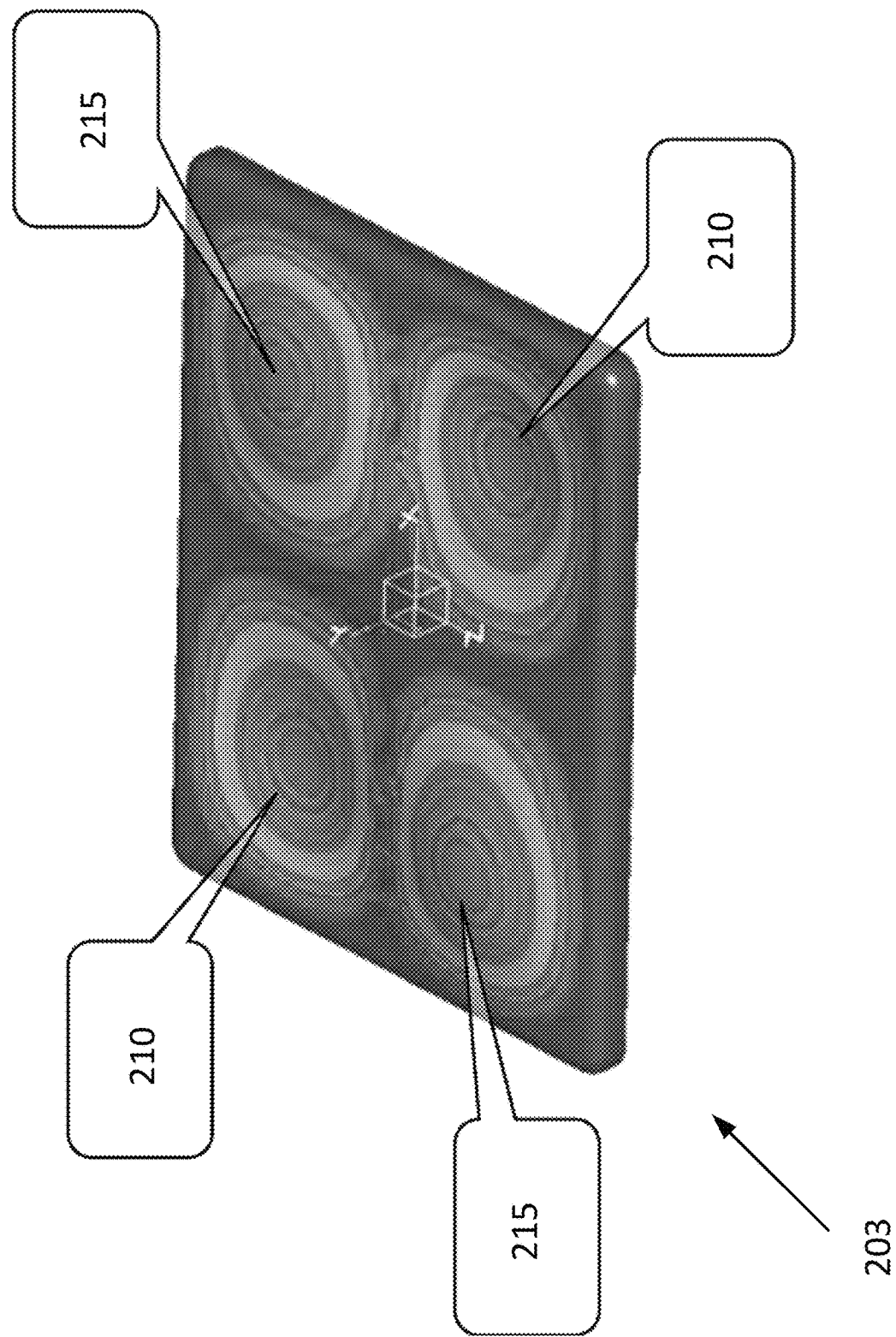
FIG. 2 depicts an example of a non-planar IHS surface.

As noted above, in embodiments where an IHS such as IHS 103 absorbs heat from a package such as package 105, the IHS may deform. More specifically, the surface of the IHS may deform to a non-planar state. FIG. 2 depicts an example of a non-planar surface of an IHS 203, which may be similar to IHS 103. The surface of the IHS 203 may include low points 210, and high points 215. As noted above, because of the low points 210 and high points 215, it may be difficult to mate a thermal solution such as a vapor chamber to the surface of the IHS 203.

Figure 3:
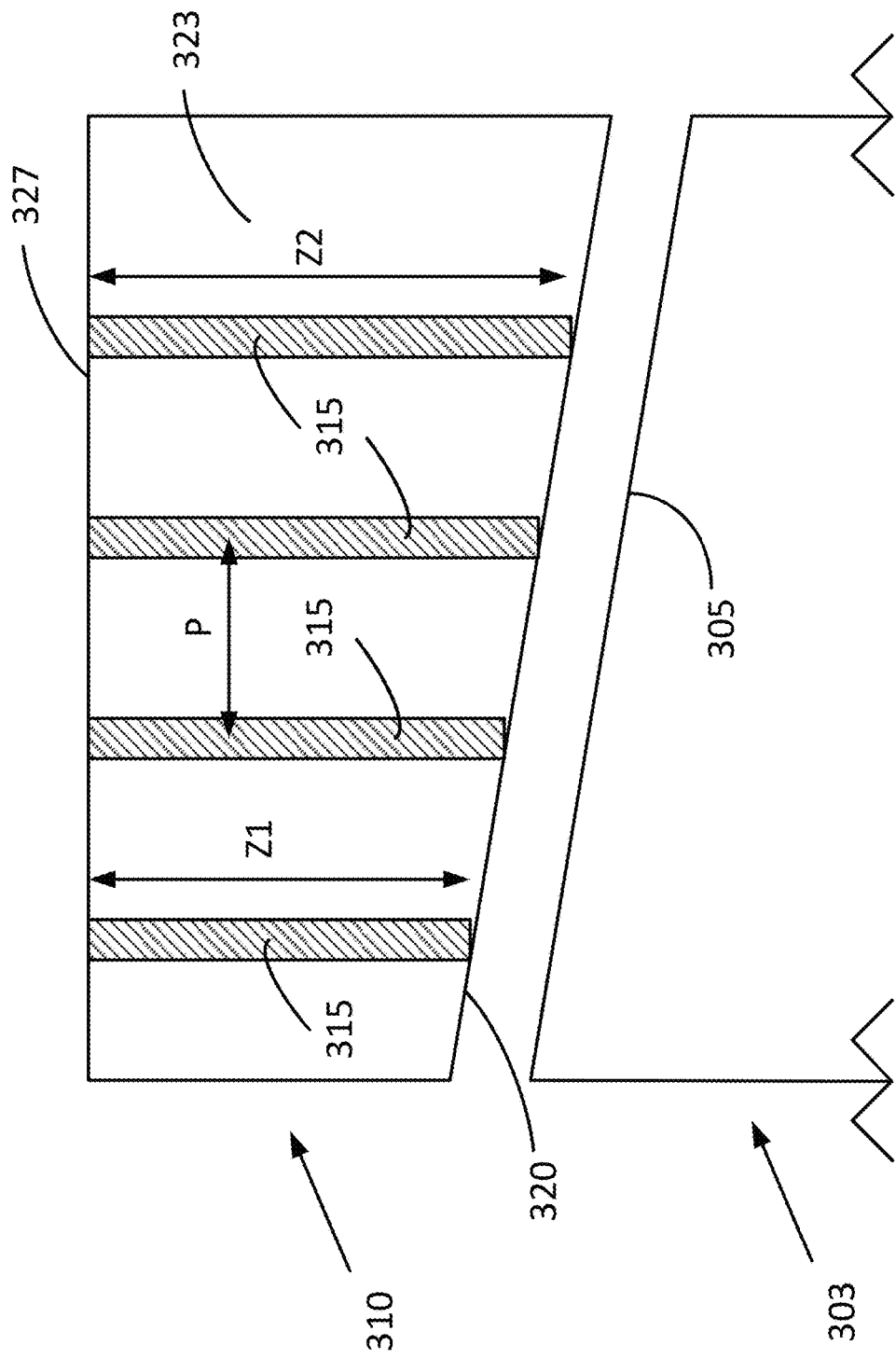
FIG. 3 depicts an example of a non-planar conforming heatsink, in accordance with various embodiments herein.

FIG. 3 depicts a highly simplified example of a vapor chamber 310 mating with an IHS 303. Specifically, the vapor chamber 310 may be similar to vapor chamber 110. The IHS 303 may be similar to IHS 103. As can be seen, the surface 305 of the IHS 303 may be non-planar. More specifically, the surface 305 may slope down from the left side of the Figure to the right side of the Figure. It will, however, be understood that this is a highly simplified example and other embodiments the surface 305 of the IHS 303 may have low points and high points such as those shown in FIG. 2, or some other type of non-planarity.

The vapor chamber 310, as noted previously, may include a bottom sidewall with a bottom surface 320 and a top sidewall with a top surface 327 which may, along with vertical sidewalls of the vapor chamber 310, define a chamber 323. In embodiments, the surfaces 320 and 327 may be formed of a relatively soft, thermally conductive material such as copper or some other appropriate material.

As noted above, then non-planar profile of the surface 305 of the IHS 303 may be known. Therefore, in embodiments one or more pillars 315 may be positioned within the chamber 323, and help to deform the bottom surface 320 of the vapor chamber 310 to a non-planar profile that matches the profile of the surface 305. For example, in the embodiment of FIG. 3, one pillar 315 may have a Z-height Z1 that is smaller than the Z-height Z2 of another of the pillars 315. In general, the pillars 315 may have heights on the order of approximately 1 millimeter (mm) to approximately 4 mm. Finally, the pillars 315 may have a diameter between approximately 1 mm and approximately 5 mm, and more specifically the diameter may be between approximately 2 mm and approximately 3 mm. Finally, the pillars 315 may have a pitch P of between approximately 5 mm and approximately 15 mm. As used herein, "pitch" may refer to a lateral distance from the center of one pillar 315 to the center of an adjacent pillar.

It will be recognized that the various dimensions of the pillars 315 given above are intended as one example, however other embodiments may have pillars with one or more other dimensions. The specific dimensions of the pillars 315 may be based on a variety of factors such as the predicted deformation of the IHS 303, the size of the vapor chamber 310, the amount of load that is to be applied to mate the vapor chamber 310 to the IHS 303, or some other factor. In some embodiments the pillars 315 may not have a generally circular cross-sectional area, and instead may be square, rectangular, triangular, etc. In these embodiments, the pillars may still have a cross-sectional area between approximately 1 mm and approximately 5 mm, and more specifically between approximately 2 mm and approximately 3 mm.

In some embodiments, rather than having different Z-heights as shown in FIG. 3, each of the pillars 315 may have an identical Z-height to one another when the vapor chamber 310 is not mated with another element such as an IHS of the package, however various of the pillars 315 may be constructed to "crush-to-length." That is, in embodiments, the pillars 315 may be constructed to deform when a load is applied against the bottom surface 320 of the vapor chamber 310, thereby allowing the bottom surface 320 to deform to match the surface of the IHS or package. In some embodiments, each of the pillars 315 may be configured identically to one another, while in other embodiments various of the pillars 315 may have different characteristics such as a different diameter, be constructed of a different material, etc. which may allow it to deform more or less than a neighboring pillar 315. In some embodiments various of the pillars 315 may be different sizes from one another and configured to deform as described above. Other combinations of the above-described variations may be present in other embodiments.

It will also be recognized that the depiction of the vapor chamber 310 mated to an IHS 303 is one example, however in other embodiments the vapor chamber 310 may be coupled directly to a non-planar surface of a package such as package 105. In embodiments, the non-planar profile may be relatively straight such as shown in FIG. 3, or it may have a different profile such as stairstep, curved, or some combination thereof. In each of these embodiments, the length of the pillars 315 may be such that the vapor chamber 310 is able to more fully mate with the surface of the IHS or package, thereby increasing the thermal efficiency of the vapor chamber 310.

Figure 4:
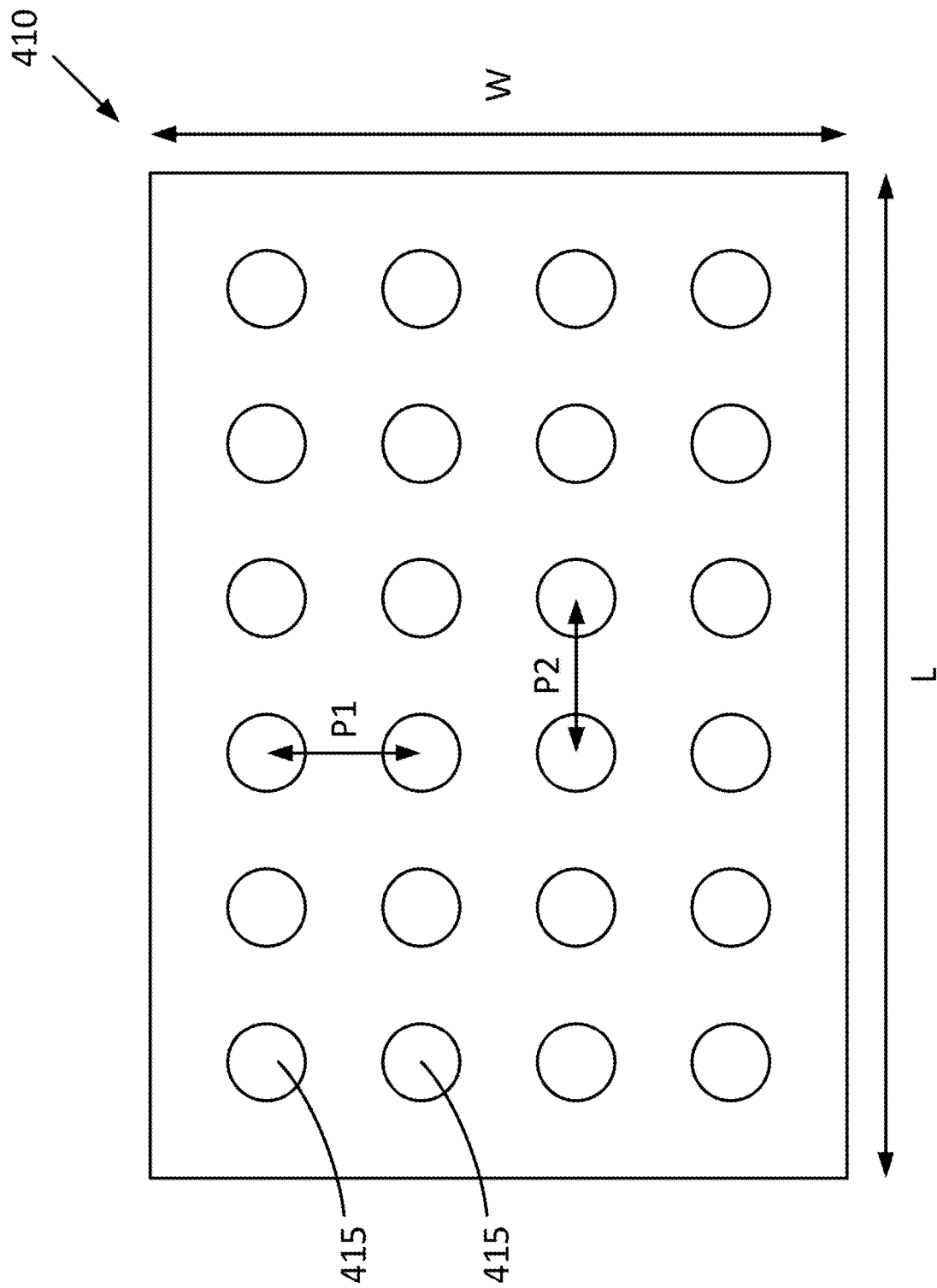
FIG. 4 depicts another example of a non-planar conforming heatsink, in accordance with various embodiments herein.

FIG. 4 depicts a simplified top-down orientation of an arrangement of pillars 415 in a vapor chamber 410. Specifically, the vapor chamber 410 may be similar to vapor chamber 310, and the pillars 415 may be similar to pillars 315.

As described with reference to FIG. 3, the pillars 415 may have a pitch P between approximately 5 mm and approximately 15 mm. However, as can be seen in FIG. 4, the pillars 415 may have two pitches. The pitch P1 may be the pitch along the width W of the vapor chamber 410, and the pitch P2 may be the pitch along the length L of the vapor chamber 410. In embodiments the pitches P1 and P2 may be identical to one another, while in other embodiments the pitch along the width W may be different than the pitch along the length L.

In some embodiments, the pillars 415 may be organized in a general grid as shown in FIG. 4, while in other embodiments the pillars 415 may be organized in some other fashion such as circular, random, specifically dependent on a known profile of an IHS or a package, or some other type of organization. Similarly, it will be recognized that even though the pillars are depicted as having a circular cross-section, in other embodiments the pillars may have a different cross-section such as square, rectangular, oval, triangular, etc.

Figure 5:
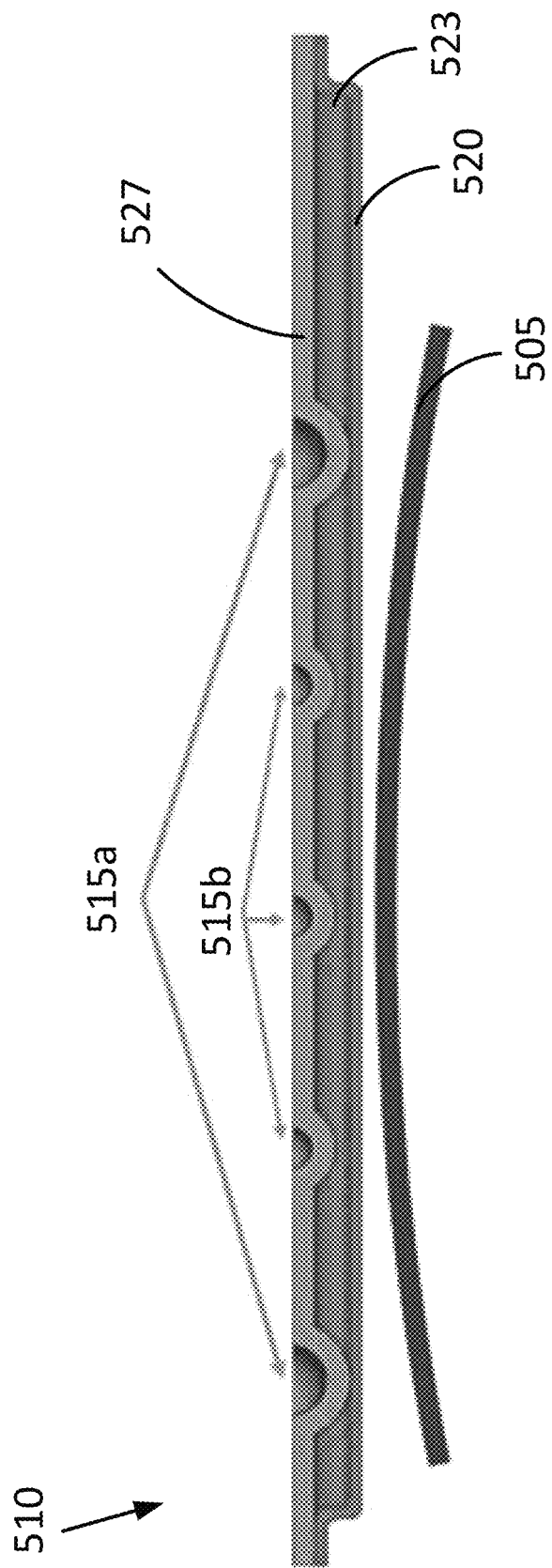
FIG. 5 depicts another example of a non-planar conforming heatsink, in accordance with various embodiments herein.

FIG. 5 depicts another example of a non-planar conforming heatsink, in accordance with various embodiments herein. Specifically, FIG. 5 depicts a vapor chamber 510, which may be similar to vapor chamber 110. The vapor chamber 510 may have a chamber 523 that is defined by a top sidewall with a top surface 527 and a bottom sidewall with a bottom surface 520, which may be respectively similar to chamber 323, top surface 327, and bottom surface 320. However, instead of pillars such as pillars 315, top surface 527 may include a plurality of dimples 515a and 515b (collectively, dimples 515). The dimples 515 may be deformations of the top surface 527, which may provide a counter force against the bottom surface 520 when a load is applied against the bottom surface 520. For example, when the vapor chamber 510 is coupled with a non-planar surface 505 of an IHS or a bare die multichip package, then the bottom surface 520 of the vapor chamber 510 may deform. The dimples 515 may help guide the deformation so that the bottom surface 520 mates with the surface 505 the IHS.

As can be seen, when the surface 505 is generally arc shaped, certain of the dimples 515 may be larger than others of the dimples. For example, outer dimples 515a may be larger than inner dimples 515b. As a result, the inner portion of the bottom surface 520, e.g. the portion of the bottom surface 520 that is beneath the inner dimples 515b, may deform more than the portion of the bottom surface that is directly below outer dimples 515a. It will be understood that this example using an arc shaped surface 505 is intended as one example, however other arrangements of dimples may be used if different types of deformation are expected. In some embodiments, all of the dimples may be the same size. Additionally, in some embodiments, the dimples may be the same size but designed to crush-to-length as described above. More specifically, the dimples may all be the same size and configured to crush similarly, while in other embodiments the dimples may be the same size but constructed such that some dimples will be more resilient to force being applied than others. In other embodiments the dimples may be different sizes and some may be designed to collapse. Various other combinations may exist in various embodiments.

Generally, the dimples 515 may have a pitch between approximately 5 mm and approximately 15 mm, and a diameter between approximately 1 mm and approximately 5 mm. However, in other embodiments the pitch or diameters may be larger or smaller. For example, in some embodiments the diameter of the dimples 515 may be between approximately 0.5 mm and 1.5 mm, while in other embodiments the dimples 515 may have a diameter between approximately 10 mm and approximately 12 mm. In embodiments, the dimples 515 may be arranged in a grid pattern similar to that depicted in FIG. 4, however in other embodiments the dimples 515 may be arranged in some other pattern such as circular, random, application specific, etc. Additionally, it will be understood that even though the vapor chamber 510 is described as mating with an IHS, in other embodiments the dimples 515 may be used to allow the vapor chamber 510 to mate with a package such as package 105.

FIG. 6 depicts an example technique that may be used to manufacture a non-planar conforming heatsink, in accordance with various embodiments herein. Generally, the technique may be described with respect to vapor chamber 310, however it will be understood that the technique may be appropriately applied to other heatsinks or other vapor chambers discussed herein with little or no modification.

The technique may include identifying, at 605, a sidewall of a heatsink that includes a chamber at least partially defined by the sidewall, wherein the sidewall includes an internal surface and an external surface opposite the internal surface. The sidewall may be, for example, the bottom sidewall that provides bottom surface 320 of the vapor chamber 310. The chamber may be chamber 323. The internal surface may be the portion of the bottom surface 320 that is internal to the vapor chamber 310, that is, within chamber 323. The external surface may be the portion of the bottom surface 320 that is to couple with the IHS 303.

The technique may further include positioning, at 610, within the chamber of the heatsink, a plurality of structural elements. The plurality of structural elements may be, for example, pillars 315. In other embodiments, the plurality of structural elements may be the dimples 515. Generally, the plurality of structural elements may be to facilitate deformation of the sidewall to a non-planar state when the external surface is coupled with a heat source such as an IHS, a package, or some other heat source.

FIG. 7 illustrates an example computing device 1500 suitable for use with vapor chambers 110, 310, 410, or 510, in accordance with various embodiments. Specifically, in some embodiments, the computing device 1500 may include one or more of vapor chambers 110, 310, 510, or 510 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase-change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of vapor chambers 110, 310, 410, or 510. For example, in some embodiments the processor 1502, memory 1504, or some other component of the computing device 1500 may be coupled with one or more of the 110, 310, 410, or 510, either directly or through an IHS.

EXAMPLES OF VARIOUS EMBODIMENTS

Example 1 includes an electronic device comprising: a heat source; and a heatsink physically and thermally coupled with the heat source, wherein the heatsink includes a structural element internal to the heatsink, wherein the structural element is to cause a surface of the heatsink to deform to a non-planar configuration when the heatsink is coupled to the heat source.

Example 2 includes the electronic device of example 1, wherein the heat source is an integrated heat spreader (IHS) or a semiconductor package.

Example 3 includes the electronic device of example 1, wherein the structural element is a pillar.

Example 4 includes the electronic device of example 1, wherein the structural element is a dimple in a surface of the heatsink that is opposite the surface to which the heat source is coupled.

Example 5 includes the electronic device of any of examples 1-4, wherein the structural element has a cross-sectional area between 1 millimeter (mm) and 5 mm.

Example 6 includes the electronic device of example 5, wherein the structural element has a cross-sectional area between 2 mm and 3 mm.

Example 7 includes the electronic device of any of examples 1-4, wherein the structural element is a first structural element and further comprising a second structural element internal to the heatsink, wherein the first structural element is between 5 millimeters (mm) and 15 mm from the second structural element in a direction parallel to the surface of the heatsink.

Example 8 includes the electronic device of any of examples 1-4, wherein the non-planar configuration is based on a non-planarity of a surface of the heat source to which the heatsink is coupled.

Example 9 includes the electronic device of example 8, wherein the non-planarity of the surface of the heat source is based on thermal energy received from a die coupled with the heat source.

Example 10 includes the electronic device of any of examples 1-4, wherein the heatsink is a vapor chamber.

Example 11 includes the electronic device of any of examples 1-4, wherein a Z-height of the structural element as measured in a direction perpendicular to the surface of the heatsink is based on a predicted deformation of the heat source.

Example 12 includes the electronic device of any of examples 1-4, wherein the structural element is deformable when the heatsink is coupled with the heat source.

Example 13 includes a heatsink comprising: a chamber; a sidewall that at least partially defines the chamber, wherein the sidewall includes an external surface configured to physically and thermally couple with a heat source and an internal surface opposite the external surface; and a plurality of structural elements positioned within the chamber and physically coupled with the internal surface, wherein the plurality of structural elements are to facilitate deformation of the sidewall to a non-planar state when the external surface is coupled with the heat source.

Example 14 includes the heatsink of example 13, wherein a structural element of the plurality of structural elements is a pillar.

Example 15 includes the heatsink of example 13, wherein the heat source is an integrated heat spreader (IHS) or a semiconductor package.

Example 16 includes the heatsink of example 13, wherein a structural element of the plurality of structural elements is a semi-spherical protrusion of a sidewall of the heatsink that is opposite the sidewall that is to couple with the heat source.

Example 17 includes the heatsink of any of examples 13-16, wherein the structural element has a diameter between 1 millimeter (mm) and 5 mm.

Example 18 includes the heatsink of example 17, wherein the structural element has a diameter between 2 mm and 3 mm.

Example 19 includes the heatsink of any of examples 13-16, wherein the plurality of structural elements have a pitch between 5 millimeters (mm) and 15 mm.

Example 20 includes the heatsink of any of examples 13-16, wherein the heatsink is a vapor chamber.

Example 21 includes the heatsink of any of examples 13-16, wherein a Z-height of a structural element of the plurality of structural elements is based on a predicted non-planar deformation of the heat source.

Example 22 includes the heatsink of any of examples 13-16, wherein the structural element is deformable when the heatsink is coupled with the source.

Example 23 includes a method of manufacturing a heatsink, wherein the method comprises: identifying a sidewall of a heatsink that includes a chamber at least partially defined by the sidewall, wherein the sidewall includes an internal surface and an external surface opposite the internal surface; and positioning, within the chamber of the heatsink, a plurality of structural elements, wherein the plurality of structural elements are to facilitate deformation of the sidewall to a non-planar state when the external surface is coupled with a heat source.

Example 24 includes the method of example 23, further comprising: identifying a predicted non-planar deformation of the heat source based on thermal energy from a die thermally coupled with the heat source; and identifying, based on the predicted non-planar deformation, a Z-height of a structural element of the plurality of structural elements.

Example 25 includes the method of example 23, wherein a structural element of the plurality of structural elements is a pillar.

Example 26 includes the method of example 23, wherein a structural element of the plurality of structural elements is a semi-spherical protrusion.

Example 27 includes the method of any of examples 23-26, wherein the structural element has a diameter between 1 millimeter (mm) and 5 mm.

Example 28 includes the method of any of examples 23-26, wherein the plurality of structural elements have a pitch between 5 millimeters (mm) and 15 mm.

Example 29 includes the method of any of examples 23-26, wherein the heatsink is a vapor chamber.

Example 30 includes the method of any of examples 23-26, wherein the heat source is an integrated heat spreader (IHS) or a semiconductor package.

Example 31 includes an electronic device comprising: a heat source that includes an integrated heat spreader (IHS) or a multi-chip die, wherein the heat source has a non-planar surface when the heat source is in use; and a vapor chamber physically and thermally coupled with the heat source by a plate of the vapor chamber, wherein the vapor chamber includes a structural element within a cavity of the vapor chamber, and wherein the structural element is to cause the plate of the vapor chamber to deform to a non-planar configuration.

Example 32 include the electronic device of example 31, wherein the structural element is a pillar or a dimple in a surface of the vapor chamber that is opposite the surface to which the heat source is coupled.

Example 33 includes the electronic device of example 31, wherein the non-planar configuration is based on the non-planar surface of the heat source.

Example 34 includes the electronic device of any of examples 31-33, wherein a Z-height of the structural element as measured in a direction perpendicular to the surface of the vapor chamber is based on a predicted deformation of the non-planar surface of the heat source.

Example 35 includes the electronic device of any of examples 31-33, wherein the structural element is deformable when the vapor chamber is coupled with the heat source.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed.

While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. An electronic device comprising:
   a heat source including a surface having a non-planar configuration when the heat source is in use; and
   a vapor chamber heatsink physically and thermally coupled with the heat source, wherein the heatsink includes:
      a first sheet of conductive material and a second sheet of conductive material joined at their edges forming a cavity;
      a first structural element within the cavity connected to the first and second sheets of conductive material, the first structural element having a first length in a Z-dimension; and
      a second structural element in the cavity connected to the first and second sheets of conductive material, the second structural element having a second length in the Z-dimension different from the first length, wherein the first and second structural elements form a non-planar configuration on a surface of the heatsink that mates with the non-planar configuration on the surface of the heat source.

2. The electronic device of claim 1, wherein the heat source is an integrated heat spreader (IHS) or a semiconductor package.

3. The electronic device of claim 1, wherein the first structural element or the second structural element is a pillar.

4. The electronic device of claim 1, wherein the first and second structural elements have a diameter between 1 millimeter (mm) and 5 mm.

5. The electronic device of claim 1, wherein the first structural element is at a distance between 5 millimeters (mm) and 15 mm from the second structural element as measured in a direction parallel to the surface of the heatsink.

6. The electronic device of claim 1, wherein the non-planar configuration on the surface of the heatsink includes a high point or a low point.

7. The electronic device of claim 1, wherein the first length of the first structural element and the second length of the second structural element are based on a predicted deformation of the heat source.

8. The electronic device of claim 1, wherein the first structural element is configured to deform to the first length under an applied load.

9. A vapor chamber heatsink comprising:
   a first sheet of conductive material and a second sheet of conductive material joined at their edges defining a chamber, wherein the first sheet of conductive material includes an external surface configured to physically and thermally couple with a heat source; and
   a plurality of structural elements positioned within the chamber and physically coupled to the first and second sheets of conductive material, wherein the plurality of structural elements includes first structural elements having a first length in a Z-dimension and second structural elements having a second length in the Z-dimension different from the first length, and wherein the first and second structural elements are configured to deform the external surface of the first sheet of conductive material to a non-planar state.

10. The heatsink of claim 9, wherein the first or second structural elements of the plurality of structural elements are pillars.

11. The heatsink of claim 9, wherein the plurality of structural elements have a pitch between 5 millimeters (mm) and 15 mm.

12. The heatsink of claim 9, wherein the first length of the first structural elements and the second length of the second structural elements of the plurality of structural elements are based on a predicted non-planar deformation of the heat source.

13. The heatsink of claim 9, wherein the first structural elements are configured to deform to the first length under an applied load.

14. A method of manufacturing a heatsink, wherein the method comprises:
   joining a first sheet of conductive material and a second sheet of conductive material at their edges to form a vapor chamber heatsink that includes a chamber, wherein the first sheet of conductive material includes an external surface coupled with a heat source; and
   positioning, within the chamber of the heatsink, a plurality of structural elements, and physically coupling the plurality of structural elements to the first and second sheets of conductive material, wherein the plurality of structural elements includes first structural elements having a first length in a Z-dimension and second structural elements having a second length in the Z-dimension different from the first length, and wherein the first and second structural elements are configured to deform the external surface of the first sheet of conductive material to a non-planar state.

15. The method of claim 14, further comprising:
   identifying a predicted non-planar deformation of the heat source based on thermal energy from a die thermally coupled with the heat source; and
   identifying, based on the predicted non-planar deformation, the first length of the first structural elements and the second length of the second structural elements of the plurality of structural elements.

16. The method of claim 14, wherein the first and second structural elements have a diameter between 1 millimeter (mm) and 5 mm.

17. The method of claim 14, wherein the heatsink is a vapor chamber.

18. The method of claim 14, wherein the heat source is an integrated heat spreader (IHS) or a semiconductor package.

19. An electronic device comprising:
   a heat source that includes an integrated heat spreader (IHS) or a multi-chip die, wherein the heat source has a non-planar surface when the heat source is in use; and
   a vapor chamber including a first plate of conductive material and a second plate of conductive material joined at their edges to form a cavity, the vapor chamber physically and thermally coupled with the heat source by the first plate of the vapor chamber, wherein the vapor chamber includes first structural elements having a first length in a Z-dimension and second structural elements having a second length in the Z-dimension different from the first length within the cavity of the vapor chamber, wherein the first structural elements and the second structural elements are connected to the first and second plates of conductive material, and wherein the first structural elements and the second structural elements are configured to deform the first plate of the vapor chamber to a non-planar configuration.

20. The electronic device of claim 19, wherein the first or second structural elements are pillars.

21. The electronic device of claim 19, wherein the non-planar configuration of the first plate of the vapor chamber includes a high point or a low point.

22. The electronic device of claim 19, wherein the first length of the first structural elements and the second length of the second structural elements are based on a predicted deformation of the non-planar surface of the heat source.

23. The electronic device of claim 19, wherein the first structural elements are configured to deform to the first length under an applied load.

* * * * *